US006458223B1

(12) United States Patent
Hans Thieme et al.

(10) Patent No.: US 6,458,223 B1
(45) Date of Patent: *Oct. 1, 2002

(54) ALLOY MATERIALS

(75) Inventors: Cornelis Leo Hans Thieme, Westborough, MA (US); Elliott D. Thompson, Coventry, RI (US); Leslie G. Fritzemeier, Acton, MA (US); Robert D. Cameron, Franklin, MA (US); Edward J. Siegal, Malden, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/283,777

(22) Filed: Mar. 31, 1999

Related U.S. Application Data

(63) Continuation-in-part of application No. 08/943,047, filed on Oct. 1, 1997, now abandoned.

(51) Int. Cl.[7] .............................. C22C 9/06; B23K 39/24
(52) U.S. Cl. ....................... 148/435; 505/470; 505/474; 505/500
(58) Field of Search ..................... 148/435; 505/470, 505/474, 434, 500

(56) References Cited

U.S. PATENT DOCUMENTS

| | | |
|---|---|---|
| 1,823,938 A | 9/1931 | Henke |
| 2,585,613 A | 2/1952 | Allen |
| 2,739,907 A | 3/1956 | Nowak et al. .............. 117/106 |
| 3,109,331 A | 11/1963 | Cordray et al. ................ 80/60 |
| 3,615,917 A | 10/1971 | Shin et al. .................. 148/111 |
| 3,648,355 A | 3/1972 | Shida et al. ............... 29/471.7 |
| 3,692,596 A | 9/1972 | Fraser et al. |
| 3,700,427 A | 10/1972 | Hoppin, III et al. ........ 75/0.5 R |
| 3,713,211 A | 1/1973 | Freeman, Jr. ................ 29/599 |
| 3,770,497 A | 11/1973 | Hässler et al. .............. 117/212 |
| 3,778,237 A | 12/1973 | Shapiro et al. .............. 29/199 |
| 3,845,543 A | 11/1974 | Roth et al. ................. 29/472.3 |
| 3,982,973 A | 9/1976 | Peters et al. .................. 148/32 |
| 4,024,617 A | 5/1977 | McCormick ............. 29/156.63 |
| 4,105,828 A | 8/1978 | Borchert et al. ............. 428/665 |
| 4,145,481 A | 3/1979 | Gupta et al. ................. 428/678 |
| 4,148,973 A | 4/1979 | Sexton et al. |
| 4,246,321 A | 1/1981 | Shibata ....................... 428/614 |
| 4,283,225 A | 8/1981 | Sexton et al. |
| 4,367,102 A | 1/1983 | Wilhelm ..................... 148/133 |
| 4,416,916 A | 11/1983 | Aykan et al. ................ 427/160 |
| 4,431,462 A | 2/1984 | Gould et al. ............ 148/11.5 Q |
| 4,537,642 A | 8/1985 | Saito et al. ............. 148/11.5 Q |
| 4,578,320 A | 3/1986 | Mahulikar et al. .......... 428/674 |
| 4,640,816 A | 2/1987 | Atzmon et al. ............... 419/24 |
| 4,749,628 A | 6/1988 | Ahlert et al. ............... 428/660 |
| 4,788,082 A | 11/1988 | Schmitt ................... 427/248.1 |
| 4,909,859 A | 3/1990 | Nazmy et al. ......... 148/11.5 N |
| 4,917,967 A | 4/1990 | Cupolo et al. .............. 428/669 |
| 4,927,788 A | 5/1990 | Nakashima et al. ......... 439/887 |
| 4,939,308 A | 7/1990 | Maxfield et al. ................ 505/1 |
| 4,980,341 A | 12/1990 | Gehring .......................... 505/1 |
| 4,990,492 A | 2/1991 | Creedon et al. |
| 4,994,435 A | 2/1991 | Shiga et al. ..................... 505/1 |
| 4,994,633 A | 2/1991 | Puhn et al. |
| 5,006,507 A | 4/1991 | Woolf et al. |
| 5,010,053 A | 4/1991 | Maroni ........................... 505/1 |
| 5,019,552 A | 5/1991 | Balooch et al. ................. 505/1 |
| 5,019,555 A | 5/1991 | Chin et al. |
| 5,047,389 A | 9/1991 | Woolf et al. .................... 505/1 |
| 5,057,489 A | 10/1991 | Ohkawa et al. |
| 5,059,582 A | 10/1991 | Chung ............................ 505/1 |
| 5,063,200 A | 11/1991 | Okada et al. ................... 505/1 |
| 5,073,240 A | 12/1991 | Raggio et al. |
| 5,074,907 A | 12/1991 | Amato et al. ................. 75/235 |
| 5,080,296 A | 1/1992 | Raggio et al. |
| 5,089,057 A | 2/1992 | Plewes ....................... 148/12.7 |
| 5,102,865 A | 4/1992 | Woolf et al. .................... 505/1 |
| 5,108,982 A | 4/1992 | Woolf et al. |
| 5,110,790 A | 5/1992 | Feenstra et al. ................ 505/1 |
| 5,114,087 A | 5/1992 | Fisher et al. |
| 5,118,663 A | 6/1992 | Woolf et al. |
| 5,123,586 A | 6/1992 | Woolf et al. |
| 5,140,006 A | 8/1992 | Woolf |
| 5,147,849 A | 9/1992 | Tanaka et al. .................. 505/1 |
| 5,149,681 A | 9/1992 | Ohkawa et al. |
| 5,149,684 A | 9/1992 | Woolf et al. |
| 5,164,360 A | 11/1992 | Woolf et al. .................... 505/1 |
| 5,198,043 A | 3/1993 | Johnson ....................... 148/512 |

(List continued on next page.)

FOREIGN PATENT DOCUMENTS

| | | |
|---|---|---|
| CA | 697916 | 11/1964 |
| EP | 0 410 373 A2 | 1/1991 |
| EP | 0 312 015 B1 | 12/1992 |
| EP | 0 341 788 B1 | 8/1993 |
| JP | 1-100818 | 4/1989 |
| JP | 1-100820 | 4/1989 |
| JP | 0627944 | 4/1994 |
| JP | 6-139848 | 5/1994 |
| WO | WO 96/32201 | 10/1996 |

OTHER PUBLICATIONS

Baxter et al., Artifacts in Transmission Electron Microscope Images of Artifically Layered Metallic Superlattices, *Appl. Phys. Lett* 48: 1202–1204 (May 1986).

(List continued on next page.)

*Primary Examiner*—Deborah Jones
*Assistant Examiner*—Bryant Young
(74) *Attorney, Agent, or Firm*—Fish & Richardson, P.C.

(57) ABSTRACT

An alloy that contains at least two metals and can be used as a substrate for a superconductor is disclosed. The alloy can contain an oxide former. The alloy can have a biaxial or cube texture. The substrate can be used in a multilayer superconductor, which can further include one or more buffer layers disposed between the substrate and the superconductor material. The alloys can be made a by process that involves first rolling the alloy then annealing the alloy. A relatively large volume percentage of the alloy can be formed of grains having a biaxial or cube texture.

18 Claims, 11 Drawing Sheets

U.S. PATENT DOCUMENTS

| | | | |
|---|---|---|---|
| 5,200,391 A | 4/1993 | Fisher et al. | |
| 5,204,313 A | 4/1993 | Lelental et al. | 505/1 |
| 5,206,216 A | 4/1993 | Yoshida | 505/1 |
| 5,212,148 A | 5/1993 | Roas et al. | 505/1 |
| 5,225,031 A | 7/1993 | McKee et al. | 156/612 |
| 5,231,074 A | 7/1993 | Cima et al. | 505/1 |
| 5,238,752 A | 8/1993 | Duderstadt et al. | 428/623 |
| 5,240,905 A | 8/1993 | Tanaka et al. | 505/1 |
| 5,248,662 A | 9/1993 | Yoshida et al. | 505/1 |
| 5,256,205 A | 10/1993 | Schmitt, III et al. | 118/723 |
| 5,258,364 A | 11/1993 | Yamazaki | 505/1 |
| 5,270,294 A | 12/1993 | Wu et al. | 505/1 |
| 5,273,959 A | 12/1993 | Lambert et al. | 505/1 |
| 5,284,825 A | 2/1994 | Stephens et al. | |
| 5,290,761 A | 3/1994 | Keating et al. | 505/1 |
| 5,312,804 A | 5/1994 | Petibon et al. | 505/434 |
| 5,330,966 A | 7/1994 | Hayashi et al. | 505/473 |
| 5,340,792 A | 8/1994 | Ovshinsky et al. | 505/123 |
| 5,356,672 A | 10/1994 | Schmitt, III et al. | 427/446 |
| 5,356,673 A | 10/1994 | Schmitt et al. | 427/446 |
| 5,360,784 A | 11/1994 | Kimura et al. | 505/433 |
| 5,372,089 A | 12/1994 | Yoshida et al. | 117/98 |
| 5,378,683 A | 1/1995 | Cabanel et al. | 505/190 |
| 5,379,019 A | 1/1995 | Fiddes et al. | 335/216 |
| 5,426,092 A | 6/1995 | Ovshinsky et al. | 505/461 |
| 5,427,866 A | 6/1995 | Nagaraj et al. | 428/610 |
| 5,432,151 A | 7/1995 | Russo et al. | 505/474 |
| 5,434,130 A | 7/1995 | Hikata et al. | 505/433 |
| 5,439,877 A | 8/1995 | Face | 505/475 |
| 5,470,668 A | 11/1995 | Wu et al. | 428/688 |
| 5,482,578 A | 1/1996 | Rose et al. | 148/516 |
| 5,516,484 A | 5/1996 | Kubosono et al. | 420/469 |
| 5,527,765 A | 6/1996 | Hodge et al. | 505/236 |
| 5,545,612 A | 8/1996 | Mizushima et al. | 505/239 |
| 5,571,332 A | 11/1996 | Halpern | 118/723 |
| 5,629,268 A | 5/1997 | Tanaka et al. | 505/329 |
| 5,645,893 A | 7/1997 | Rickerby et al. | 427/405 |
| 5,648,321 A | 7/1997 | Bednorz et al. | 5005/473 |
| 5,650,378 A | 7/1997 | Iijima et al. | 505/473 |
| 5,660,746 A | 8/1997 | Witanachchi et al. | 219/121.66 |
| 5,667,663 A | 9/1997 | Rickerby et al. | 205/170 |
| 5,672,569 A | 9/1997 | Nakamura et al. | 505/430 |
| 5,693,140 A | 12/1997 | McKee et al. | 117/108 |
| 5,696,392 A | 12/1997 | Char et al. | 257/190 |
| 5,703,341 A | 12/1997 | Lowndes et al. | 219/121.66 |
| 5,739,086 A | 4/1998 | Goyal et al. | 505/473 |
| 5,741,377 A | 4/1998 | Goyal et al. | 148/512 |
| 5,872,081 A | 2/1999 | Woolf et al. | |
| 5,964,966 A | 10/1999 | Goyal et al. | 148/426 |
| 5,968,877 A | 10/1999 | Budai et al. | |
| 6,022,832 A | 2/2000 | Fritzemeier et al. | |
| 6,027,564 A | 2/2000 | Fritzemeier et al. | |

OTHER PUBLICATIONS

Eom et al., "Frequency Stabilization of a 612 nm He–Ne Laser in a Transverse Magnetic Field," *Appl. Phys. Lett* 57:739–740 (Aug. 190).

Sadakata et al., Preparation of Aligned High Tc Superconducting Composite Tape by Laser Deposition Process on Metallic Substrate, *Cryogenics* 7 (Jul. 1991).

Yoshida et al., "Y–Ba–Cu–O Films Grown on Flexible Polycrystalline Substrates by Excimer Laser Ablation," Advances in Superconductivity III, 901–904 (Nov. 1990).

Ginsbach et al., "Electrical and Structural Properties of $YBa_2Cu_3O_7$ Films on PO and Single Crystalline Oxides of Cu and Ni," Physica C 185–189 pp. 2111–2112 (1991), No Month.

Goyal, "Advances in Processing High–$T_c$ Superconductors for Bulk Applications," JOM p. 11 (Dec. 1994).

Goyal, "Progress Toward Bulk Application of High–$T_c$ Superconductors," JOM p. 55 (Aug. 1995).

Norton et al., "Epitaxial $YBa_2Cu_3O_7$ on Biaxially Textured Nickel (001): An Approach to Superconductivity Tapes with High Critical Density," Science, vol. 274 p. 755 (Nov. 1996).

Schlom et al., "Origin of the ø–±9° Peaks in $YBa_2Cu_3O_7$ δFilms Grown on Cubic Zirconia Substrates," H13.49 p. 272, No Date.

Budai et al., "In–plane Alignment of YBaCuO Films on Metal Substrates and Buffer Layers," H13.52, p. 272, No Date.

Yoshino et al., "Improvement on In–Plane Alignment of Grains in YBCO Films on Ag Tapes," Advances in Superconductivity VI, pp. 759–762, No Date.

Budai et al., "In–plane epitaxial alignment of $YBa_2Cu_3O_{7+x}$ films grown on silver crystals and buffer layers," Appl. Phys. Lett. 62 (15), pp. 1836–1838 (Apr. 1993).

Feldman et al., "Epitaxial Growth of A15 $Nb_3Si$," IEEE Transactions on Magnetics, vol. Mag–17, No. 1, pp. 545–548 (Jan. 1981).

Norton et al., "Superconducting Transport Properties and Surface Microstructure for $YBa_2Cu_3O_{7-\delta}$ Based Superlattices . . . ," Submitted to Workshop on Laser Ablation Mechanisms and Applications (May 1991).

Norton et al., "$YBa_2Cu_3O_{7-x}$ Thin Film Growth on Single Crystal and Polycrystalline Yttria–Stabilized Zirconia," Submitted to the Conf. on Science and Technology of Thin–Film Superconductors (Apr. 1990).

Christen et al., "Transport Critical Currents in Epitaxial . . . Thin Films," prepared by the Solid State Division Oak Ridge National Laboratory (Jul. 1989).

Dionne et al., "Magnetic and Stress Characterization of Nickel Ferrite Ceramic Films Grown by Jet Vapor Deposition," (1995) No Month.

Brick et al., "Effects of Various Solute Elements on the Hardness and Rolling Textures of Copper," Trans. Am. Soc. for Metals, vol. 31, pp. 675–698 (1943) No Month.

Goldacker et al., "Biaxially textured substrate tapes of Cu, Ni, alloyed Ni, (Ag) for YBBQ films," Applied Superconductivity 1997, vol. 2, pp. 1279–1282, see Abstract, No Month.

Doi et al., "A New Type of Superconducting Wire: Biaxially Oriented $Tl_1$ $(Ba_{0.8}Sr_{0.2})$ . . . ," Advances in Super–conductivity VII, pp. 817–820, No Date.

Ginsbach, A et al., "Growth of C–Axis Oriented YBaCuO Films on Oxidized Textured Ni Sheets and on (100) and (110) Oriented NiO Single Crystals," IEEE Transactions on Magnetics, vol. 27, No. 2, pp. 1410–1413 (Mar. 1991).

Smallman et al., "Advances in the theory of deformation and recrystallization texture formation," Materials Science and Engineering, A184, pp. 97–112 (1994), No Month.

Goler and Sachs, Zeitschrift fur Physik, vol. 59, pp. 485–494 (1929) (German Version) No Month.

Goler and Sachs, Zeitschrift fur Physik, vol. 59, pp. 485–494 (1929) (English Translation) No Month.

Detert et al., Zeitschrift fur Metallkunde, vol. 54, pp. 263–270 (1963) (German Version) No Month.

Detert et al., Zeitschrift fur Metalkunde, vol. 54, pp. 263–270 (1963) (English Translation) No Month.

Goler and Sachs, Zeitschrift fur Physik, vol. 59, pp. 477–484 (1929) (German Version) No Month.

Goler and Sachs, Zeitschrift fur Physik, vol. 59, pp. 477–484 (1929) (English Translation) No Month.

Dillamore and Roberts, Metallurgic Reviews vol. 10, pp. 271–377 (1965) No Month.

*ASM Handbook Volumn 2: Properties and Selection: Non-ferrous Alloys and Special –Purpose Materials*, ed. by Davis et al., pub. by ASM International, 1992, page 436.

| | |
|---|---|
| 101 | SELECT AND WEIGH THE CONSTITUENTS Cu, E, AND OPTIONAL Ni. |
| 102 | MELT THE CONSTITUENTS. |
| 103 | (OPTION) REMELT TO ENHANCE HOMOGENEITY. |
| 104 | SHAPE THE SOLIDIFIED MELT AND HOMOGENIZE BY HEAT TREATMENT. |
| 105 | DEFORM THE SHAPE TO A SMALLER SIZE AND RECRYSTALLIZE TO FORM A SMALL GRAIN SIZE IF DESIRED. |
| 106 | DEFORM THE SHAPE IN AN AXIALLY SYMMETRIC MANNER TO A SMALLER SIZE. |
| 107 | DEFORM THE ALLOY IN A PLANAR MANNER TO A REDUCTION IN THICKNESS EXCEEDING 85% BUT NOT MORE THAN 99.9% |
| 108 | HEAT TREAT AT A TEMPERATURE EXCEEDING 250°C BUT NOT MORE THAN 95% OF THE MELTING TEMPERATURE. |
| 109 | (OPTION) ANNEAL IN A GAS FLOW WITH LOW OXYGEN, PARTIAL PRESSURE TO FORM AN EPITAXIAL OXIDE LAYER. |

| 200 | |
|---|---|
| 201 | PREPARING A CAN USING Cu, CuNi OR Ni STOCK, OR Cu, CuNi OR Ni ALLOYED WITH A SMALL AMOUNT OF OXIDE FORMER (< 1-3 AT %). |
| 202 | PREPARING Cu, Ni, OR CuNi CORE ALLOYED WITH 0 TO 100 ATOMIC % OXIDE FORMER. |
| 203 | PLACING CORE 302 IN CAN 301 AND CO-REDUCING THE COMPOSITE ASSEMBLY TO A SMALLER CROSS SECTION. |
| 204 | DEFORMING TO THE STARTING SIZE FOR THE PLANAR ROLLING TO COMMENCE. |
| 205 | PLANAR DEFORMING THE COMPOSITE TO A REDUCTION IN THICKNESS BETWEEN 85%-99.9%. |
| 206 | HEAT TREATING TO DEVELOP A CUBE TEXTURE IN THE SHEATH, AND INDUCE HOMOGENIZATION IN THE SUBSTRATE. |
| 207 | (OPTIONAL) ANNEAL IN A GAS FLOW WITH A LOW OXYGEN PARTIAL PRESSURE TO FORM AN EPITAXIAL OXIDE LAYER. |

FIG. 3

| 300 | |
|---|---|
| 301 | PREPARING A CAN USING Cu, CuNi OR Ni STOCK, OR Cu, CuNi OR Ni ALLOYED WITH A SMALL AMOUNT OF OXIDE FORMER (< 1-3 AT %). |
| 302 | SELECT AND WEIGH THE CONSTITUENT METAL OR ALLOY POWDERS AND PLACE IN THE CAN. |

| 400 | |
|---|---|
| 401 | SELECTING Ni, CuNi, OR Cu POWDER OR FOILS, THAT CONTAIN 0.2 TO 1 WEIGHT % OXYGEN. |
| 402 | SELECTING ADDITIONAL POWDERS OR FOILS FOR A TOTAL CONCENTRATION, WITH 401, OF 3 TO 50 AT % OXIDE FORMER, 0 TO 60 AT % Ni, BALANCE COPPER. |
| 403 | FILLING A CAN AND PROCESSING THE POWDER MIXTURE ACCORDING TO 203-205. NO ANNEALS ARE APPLIED UNTIL THE FINAL TEXTURING HEAT TREATMENT. |
| 404 | HEAT TREATING ACCORDING TO 206 AND (OPTION) 207 SO THAT A SMALL AMOUNT OF THE OXIDE FORMER ABSORBS THE OXYGEN IN THE Ni, CuNi, OR Cu POWDERS AND FORMS OXIDE PARTICLES, WHICH STRENGTHEN THE SUBSTRATE. |

FIG. 4

| 500 | |
|---|---|
| 501 | SELECTING ANY OF THE FOUR PROCESSES 100-400 OR PRIOR ART SUBSTRATE-FORMING PROCESSES TO MAKE A SUBSTRATE WITH REDUCED CTE. |
| 502 | PLACING A ROD OF CTE-REDUCING MATERIAL IN THE BILLET OR CORE. |
| 503 | PROCESSING THE BILLET OR CORE ACCORDING TO 100-400, INTO THE FINAL SUBSTRATE TO PRODUCE A FINAL SUBSTRATE WITH A LOW CTE CORE WHICH REDUCES THE OVERALL CTE OF THE SUBSTRATE. |

FIG. 5

| | |
|---|---|
| 601 | SELECTING ANY OF THE FIVE PROCESSES 100-500 OR PRIOR ART SUBSTRATE-FORMING PROCESSES TO MAKE A SUBSTRATE WITH REDUCED SURFACE GROOVING AND COMPLETING ANY OF THE FIVE PROCESSES INCLUDING THE TEXTURING ANNEAL. |
| 602 | ROLLING THE SUBSTRATE. |
| 603 | LOW TEMPERATURE STRESS ANNEALING THE SUBSTRATE IN A PROTECTIVE ATMOSPHERE WITHOUT RECRYSTALLIZATION TO PRODUCE A SUBSTRATE HAVING A SMOOTH SURFACE. |

ALLOY MATERIALS

CROSS REFERENCE TO RELATED APPLICATIONS

This application is a continuation-in-part of U.S. Ser. No. 08/943,047, filed Oct. 1, 1997 now abandoned.

This invention arose in part out of research pursuant to Contract No. DE-FG02-95ER81919, awarded by the Department of Energy. The United States Government has certain rights in this invention.

BACKGROUND OF THE INVENTION

The invention relates to alloys that can be used as substrates for superconductors, to superconductors including such substrates, and to methods of making these alloys and superconductors.

Superconductors, including oxide superconductors, are used in a variety of applications. Some superconductors can demonstrate limited mechanical strength. Often, the mechanical strength of a superconductor can be enhanced by forming a multilayer article that includes a layer of superconductor material and a substrate layer, but the substrate should exhibit certain properties.

The substrate should have a low Curie temperature so that the substrate is not ferromagnetic below the superconductor's critical temperature. Furthermore, chemical species within the substrate should not be able to diffuse into the layer of superconductor material, and the coefficient of thermal expansion of the substrate should be about the same as the superconductor material. Moreover, if the substrate is used for an oxide superconductor, the substrate material should be relatively resistant to oxidation.

For some materials, such as $YBa_2Cu_3O_x$ (YBCO), the ability of the material to act as a superconductor depends upon the crystallographic orientation of the material. For these superconductors, the substrate should have a crystallographic orientation that allows the material to act as a superconductor. Often, good superconducting properties are observed in these materials when the substrate has a biaxially textured surface. One type of biaxial texture is cube texture, in which the lattice is oriented such that the cube face is parallel to the surface. In addition, the cube edge in each crystallite is parallel to the cube edge in all neighboring crystallites. Examples of cube textured surfaces include the (100)[001] and (100)[011] surfaces, and an example of a biaxially textured surface is the (113)[211] surface.

Some substrates do not readily meet all these requirements, so one or more buffer layers can be disposed between the substrate and the superconductor layer. The buffer layer(s) can be comparatively resistant to oxidation, and reduce the diffusion of chemical species between the substrate and the superconductor layer. Moreover, the buffer layer(s) can have a coefficient of thermal expansion and a crystallographic orientation that is well matched with the supercondutor material.

Buffer layers are commonly formed using epitaxy. An epitaxial layer is a layer of material that is grown on a surface such that the crystallographic orientation of the layer of material is determined by the lattice structure of the surface on which the layer is grown. For example, for an epitaxial buffer layer grown on the surface of a substrate layer, the crystallographic orientation of the epitaxial layer is determined by the lattice structure of the surface of the substrate layer. Techniques used to grow epitaxial buffer layers include chemical vapor deposition and physical vapor deposition.

Some pure metals, such as copper and nickel, can be prepared to have a desirable crystallographic orientation (e.g, a biaxial texture or cube texture) by a process that involves first rolling the metal, and then annealing the metal. However, these pure metals may exhibit certain properties that are inappropriate for a superconductor supporting substrate. For example, nickel has a relatively high Curie temperature, and copper is relatively easily oxidized.

Attempts have been made to provide substrates for superconductors that are crystallographically oriented alloys. These substrates have been formed by first rolling and annealing a metal, then diffusing a different metal into the pure metal to form the alloy. This can result in a nonhomogeneous alloy.

SUMMARY OF THE INVENTION

The invention relates to alloys that can be used as substrates for superconductors, to superconductors including such substrates, and to methods of making these alloys and superconductors. The alloys can exhibit a variety of advantages, including good oxidation resistance, low Curie temperature, good homogeneity, and/or good surface texture.

In one aspect, the invention features an alloy having a biaxially textured surface. The alloy includes a first metal, a second metal and at least about 0.5 atomic percent of an oxide former. The first metal is different than the second metal, and the oxide former is different than the first and second metals. The alloy can be made by a process that includes rolling the alloy, and then annealing the alloy.

An "oxide former" as used herein, refers to a metal that tends to form oxides that are more stable, both kinetically and thermodynamically, than Cu or Ni oxides. Aluminum (Al) is a preferred oxide former.

In another aspect, the invention features an alloy that includes a first metal, a second metal and at least about 0.5 atomic percent of an oxide former. The alloy has a native oxide exterior with a biaxially textured surface. The native oxide is formed of an oxide of the oxide former. The second metal is different than the first metal, and the oxide former is different than the first and second metals. The alloy can be made by a process that includes rolling the alloy, and then annealing the alloy.

In a further aspect, the invention features an article including an alloy and an oxide layer disposed on a surface of the alloy. The alloy undergoes substantially no oxidation when the article is exposed to an atmosphere containing 1% oxygen at 900° C. for at least two hours.

In yet another aspect, the invention features an alloy with a biaxially textured surface. The alloy includes copper and from about 25 atomic percent nickel to about 55 atomic percent nickel. At least about 65 volume percent of the alloy is formed of grains having a biaxial texture. The alloy can be made by a process that includes rolling the alloy, and then annealing the alloy.

The alloys preferably have a Curie temperature of less than about 80 K (e.g., less than about 40 K or less than about 20 K).

The alloys can contain more than one oxide former.

The alloys can be homogeneous alloys.

The alloys can be relatively resistant to oxidation.

The alloys can have a surface that is biaxially textured or cube textured.

BRIEF DESCRIPTION OF THE DRAWINGS

These and other features of the invention will become more readily apparent from the following detailed description together with the accompanying drawings in which:

FIG. 1 is a block diagram illustrating a process of forming a biaxially textured alloy.

FIG. 2 is a block diagram illustrating a sheath and core approach for forming a biaxially textured alloy.

FIG. 3 is a block diagram illustrating a powder metallurgy variant of the sheath and core approach for forming a biaxially textured alloy.

FIG. 4 is a block diagram illustrating an oxide dispersion process for forming a biaxially textured alloy.

FIG. 5 is a block diagram illustrating a process for forming a biaxially textured alloy with a reduced thermal expansion coefficient.

FIG. 6 is a block diagram illustrating a process for forming a biaxially textured alloy with reduced surface grooving.

DESCRIPTION OF THE EMBODIMENTS

Figure 2A:
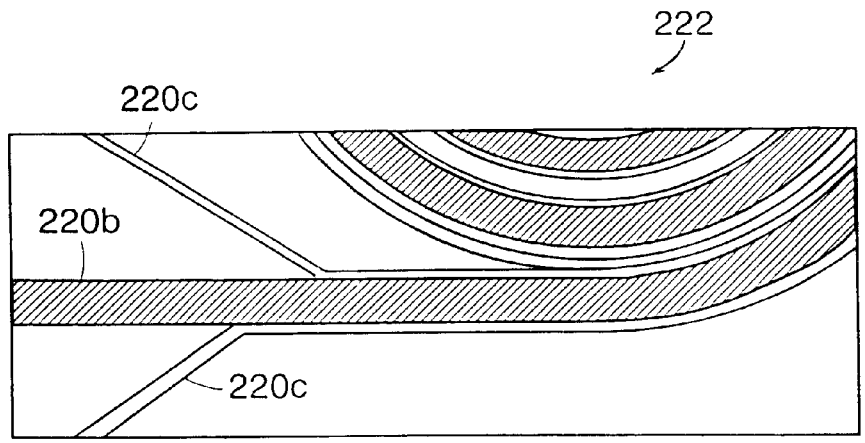
FIG. 2A illustrates foil rolling.

The invention relates to alloys that can be used as substrates for superconductors. The alloys can include two, three or more metals.

In one preferred embodiment, the alloy has the chemical formula $A_{100-x-y}B_xC_y$, where A is a first metal, B is a second metal, C is an oxide former, x is the atomic percent of B in the alloy, y is the atomic percent of C in the alloy, and (100–x–y) is the atomic percent of A in the alloy. A, B and C are each different metals.

y (i.e, the atomic percent of oxide former C in the alloy) is preferably at least about 0.5 (e.g., at least about 1 or at least about 2) and at most about 25 (e.g., at most about 10 or at most about 4).

x (i.e., the atomic percent of the second metal B in the alloy) is preferably from about 0 to about 55 (e.g., from about 25 to about 55 or from about 35 to about 55).

Examples of metals from which the first and second metals can be selected include copper (Cu), nickel (Ni), chromium (Cr), vanadium (V), aluminum (Al), silver (Ag), iron (Fe), palladium (Pd), molybdenum (Mo), gold (Au) and zinc (Zn).

In some embodiments, the first metal is copper and the second metal is nickel. In these embodiments, the alloy preferably includes from about 25 atomic percent nickel to about 55 atomic percent nickel (e.g., from about 35 atomic percent nickel to about 55 atomic percent nickel or from about 40 atomic percent nickel to about 55 atomic percent nickel). In these embodiments, the alloy can further include an oxide former, preferably aluminum.

In other embodiments, the first metal is nickel and the second metal is chromium. In these embodiments, the alloy preferably contains from about 5 atomic percent chromium to about 20 atomic percent chromium (e.g., from about 10 atomic percent chromium to about 18 atomic percent chromium or from about 10 atomic percent chromium to about 15 atomic percent chromium). In these embodiments, the alloy can further include an oxide former, preferably aluminum.

Examples of oxide formers include aluminum (Al), magnesium (Mg), titanium (Ti), zirconium (Zr), hafnium (Hf), yttrium (Y), chromium (Cr), gallium (Ga), germanium (Ge), beryllium (Be), lithium (Li), thorium (Th), silicon (Si), zinc (Zn), tin (Sn), boron (B) and the rare earth elements lanthanum (La), cerium (Ce), praseodymium (Pr), neodymium (Nd), Samarium (Sm), europium (Eu), gadolinium (Gd), terbium, (Tb), dysprosium (Dy), holmium (Ho), erbium (Er), thulium (Tm), ytterbium (Yb), lutetium (Lu) and thorium (Th).

Preferably, the oxide former is selected from Al, Mg, Cr, Li, Ti, Hf, Zr, Ce, Yb or Sn, more preferably Al, Mg, Cr, Ce or Yb, and most preferably the oxide former is Al.

The alloy preferably has a biaxially textured surface (e.g., a (113) [211] surface), more preferably a cube textured surface (e.g., a (100) [001] surface or a (100) [011] surface).

In some superconductors (e.g., YBCO), the critical current density can depend upon the grain boundary angle. For example, the presence of annealing twins, which are narrow regions inside and/or across a grain having a high angle grain boundary with biaxial or cube texture grains, can result in a region with poor electrical current transport. The region in which an annealing twin is present can effectively be closed for superconducting currents.

To minimize the effect of annealing twins, the volume percent of the alloy having grains with biaxial texture is preferably at least about about 65 volume percent (e.g., at least about 80 volume percent or at least about 85 volume percent) as measured using X-ray diffraction pole figures.

In certain embodiments, the alloy volume percent of the alloy with grains having a cube texture is at least about 65 volume percent (e.g., at least about 80 volume percent or at least about 90 volume percent) as measured using X-ray diffraction pole figures.

Preferably, the peaks in an X-ray diffraction pole figure of the alloy have a Full Width Half Maximum (FWHM) less than about 20° (e.g., less than about 15°, less than about 10° or from about 5° to about 10° ).

The alloy preferably has a Curie temperature of less than about 80 K (e.g., less than about 40 K or less than about 20 K).

The alloy is preferably homogeneous. The amount by which the concentration of constituents in the alloy varies across the cross section of the alloy is preferably less than about 15 percent (e.g, less than about five percent or less than about two percent).

In certain embodiments, the oxide former can form a native oxide on the surface of the alloy. The native oxide can reduce oxygen diffusion into the alloy contained within the native oxide. For oxygen that does diffuse into the alloy contained within the native oxide, the remaining oxide former can become preferentially oxidized.

When the native oxide is present, the alloy and native oxide can together form an article for which the first and second metals undergo substantially no oxidation (e.g, less than about 5 volume percent of the first or second metals undergo oxidation, less than about 3 volume percent of the first or second metals undergo oxidation, or less than about 1 volume percent of the first or second metals undergo oxidation) when the article is exposed to an atmosphere containing 1% oxygen at 900° C. for at least two hours (e.g., at least three hours or at least five hours).

Preferably, the native oxide is less than about 10 microns thick (e.g., less than about five microns thick or less than about two microns thick).

In certain embodiments, the alloy is substantially free of chromium (Cr), iron (Fe), cobalt (Co) and tungsten (W).

The alloy can contain more than one oxide former. For these embodiments, the total amount of oxide former is preferably at least about 0.5 atomic percent (e.g., at least about 1 atomic percent or at least about 2 atomic percent) and at most about 25 atomic percent (e.g., at most about 10 atomic percent or at most about 4 atomic percent).

In another preferred embodiment, the alloy includes copper and from about 25 atomic percent to about 55 atomic percent (e.g., from about 25 atomic percent to about 50 atomic percent or from about 25 atomic percent to about 45 atomic percent) nickel. The alloy has a biaxially textured surface or cube textured surface. The alloy can further include oxide formers as discussed above, and can form the native oxide discussed above. Preferably, the alloy has the properties (e.g., Curie temperature, volume percent of texture, homogeneity, oxidation resistance and X-ray diffraction pole figure FWHM) discussed above.

The preferred alloys can be used as a substrate for a superconductor. The superconductor material can be disposed directly onto a surface of the substrate, or one or more buffer layers can be disposed between the substrate and the superconductor material.

Examples of superconductor materials include oxide superconductor materials, such as yttrium-barium-copper-oxides, rare earth barium copper oxides, and mixtures of these two classes, wherein the YBCO yttrium is partially or completely replaced by rare earth elements such as lanthanum, cerium, praseodymium, neodymium, samarium, europium, gadolinium, terbium, dysprosium, holmium, erbium, thulium, ytterbium, lutetium and thorium. Other possible superconductor oxides include the mercury, bismuth, and thallium families. The superconductor material can be applied by any of a variety of methods, including electroplating, non-vacuum solution deposition, chemical vapor deposition, physical vapor deposition techniques such as sputtering, laser ablation, thermal evaporation, electron beam evaporation, metallorganic and/or sol-gel solution precursor methods.

A preferred precursor approach uses a metallorganic triflouroacetate precursor solution. With this approach, high temperature superconductor films are spun or dip coated onto substrates and then reacted to form the superconducting YBCO phase. The as-coated precursor includes an oxyfluoride film containing $BaF_2$. Heat treatment in a controlled atmosphere, such as that disclosed in U.S. Pat. No. 5,231,074 issued to Cima, et al., fully incorporated herein by reference, decomposes the $BaF_2$ phase and thereby crystallizes the film. This allows the nucleation and growth of an epitaxial YBCO film. Superconductor oxide films characterized by highly textured morphologies and fully dense, homogenous microstructures are capable of sustaining critical current densities in excess of $10^4$ A/cm$^2$ at 77 degrees Kelvin when prepared on non-lattice matched substrates, and critical current densities in excess of $10^6$ A/cm$^2$ at 77 degrees Kelvin when prepared on lattice matched substrates.

Preferably, the superconductor material has a thickness of from about 0.2 micrometers to about 20 micrometer (e.g., from about 1 micrometer to about 20 micrometers).

The superconductor material can be deposited directly onto a surface of the alloy substrate, or onto a buffer layer that is disposed on a surface of the alloy substrate. One or more buffer layers can be disposed between the alloy substrate and the superconductor material. The buffer layer can be formed using any of the standard techniques, including epitaxial deposition (e.g., chemical vapor deposition or physical vapor deposition), or by growing a native oxide (such as the native oxide discussed above) via exposure of the alloy to an environment containing sufficient oxygen. This native oxide can be grown epitaxially. Thus, the native oxide can have a biaxially textured surface (e.g., a (113) [211] surface), or a cube textured surface (e.g., a (100) [001] surface or a (100) [011] surface). Methods of epitaxially depositing buffer layers are disclosed in commonly assigned U.S. patent applications Ser. No. 09/007,375, filed Jan. 15, 1998, 09/007,367, filed Jan. 15, 1998, 09/007,372, filed Jan. 15, 1998, and 09/007,373, filed Jan. 15, 1998, all of which are hereby incorporated by reference in their entirety.

Examples of buffer layers include noble metals, alloys of noble metals and oxides, such as oxides with a cubic structure (e.g, MgO, $Al_2O_3$, yttria, YSZ, $SrTiO_3$, $LaAlO_3$, $YAlO_3$ or rare earth oxides such as $CeO_2$, $Yb_2O_3$, or yttria-stabilized zirconia (YSZ)). By "noble metal" is meant a metal which is thermodynamically stable under the reaction conditions employed relative to the desired superconductor material, and/or which does not react with the superconductor material or its precursors under the conditions of manufacture of the superconductor. A noble metal can be a metal different from the metallic matrix elements of the desired superconducting ceramic. A noble metal can be silver or a silver/gold alloy, but it can also be a stoichiometric excess of one of the metallic elements of the desired superconducting ceramic, such as yttrium. Silver (Ag) and silver alloys are the most preferred noble metals. other noble metals which can be used are platinum, gold, palladium, rhodium, iridium, ruthenium, rhenium, rhenium or alloys thereof. Suitable oxides such as MgO, cubic $Al_2O_3$, yttria, YSZ, or rare earth oxides such as $CeO_2$, $Yb_2O_3$ etc. or mixtures of these are typically stable oxides with a cubic structure. These materials can be used alone or in combination.

The total thickness of the buffer layer(s) is preferably from about 0.05 micrometers to about 10 micrometers (e.g., from about 0.2 to about 0.8 micrometers).

In certain embodiments, the superconductor is a multilayer structure including a textured (e.g., biaxially textured or cube textured) substrate, on which a textured (e.g., biaxially textured or cube textured) epitaxial buffer layer is disposed, and onto which a textured (e.g., biaxially textured or cube textured) epitaxial superconducting layer is disposed. In these embodiments, more than one textured epitaxial buffer can be disposed between the textured epitaxial and the textured substrate.

The buffer layer and/or superconducting layer can be on one side or both sides of the substrate, and can partially or entirely surround the substrate.

A cap layer (e.g., a metal cap layer) can be provided on top of the superconducting layer. Materials that can be used in the cap layer include noble metals and alloys of noble metals.

Figure 9:
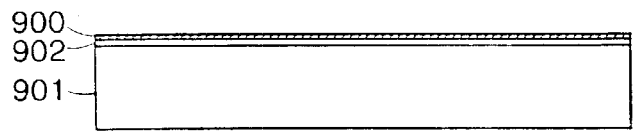
FIG. 9 illustrates a partial cross-sectional view of a superconductor composite formed with a biaxially textured alloy substrate and textured buffer layer.

FIG. 9 illustrates a partial cross-sectional view of a multilayer superconductor 900. Superconductor 900 includes an alloy substrate 901, a buffer layer 902 and a superconductor material (e.g., oxide superconductor material) layer 903.

Figure 9A:
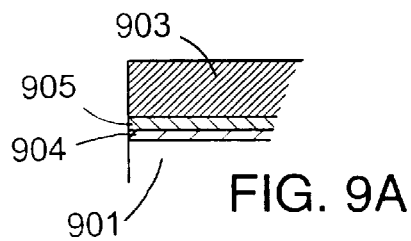
FIG. 9A and 9B illustrate partial cross-sectional views of a superconductor composite with multiple buffer layers.

FIG. 9A illustrates a partial cross-sectional view of a multilayer superconductor which includes two buffer layers (904 and 905). A layer of superconductor material (e.g., oxide superconductor material) 903 is disposed on layer 905.

Figure 9B:
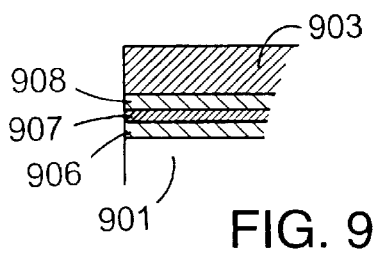

FIG. 9B shows a partial cross-sectional view of a multilayer superconductor which includes three or more buffer layers (906, 907 and 908). A layer of superconductor material (e.g., oxide superconductor material) 903 is disposed on layer 908.

The preferred alloys can be prepared by several methods. These methods produce an alloy of the first metal and the second metal to which one or more oxide formers can be added.

Referring to FIG. 1, a block diagram illustrates a melt process 100 for forming a preferred alloy article with a biaxially, and preferably cube, textured surface. The method includes selecting, weighing and mixing the constituent metals of the alloy (Step 101).

The mixture is melted (Step 102) by various processes known in the art, such as arc melting, induction melting, melting in an electrical resistance furnace, or a furnace heated by gas or coal. Melting temperatures can be from about 900° C. to about 1250° C. A certain level of homogenization is achieved during the melt process due to convection, mechanical stirring, or stirring induced by the melting techniques such as in an induction melter. The melting can optionally be performed in air, or under a protective atmosphere such as nitrogen, argon, helium or high vacuum.

Melting can be repeated a few times to further increase homogenization (Step 103).

The melt is then cooled within the furnace and the solidified melt is shaped, preferably into a bar. The bar is reduced in diameter (e.g., by a factor of 1.3 to 5) by rolling, swaging, drawing or extrusion, and is then heat treated to further homogenize the alloy (Step 104).

A further mechanical reduction in diameter, by similar mechanical techniques follows, to a size where the planar deformation process will commence (Step 105). Before or at this stage, a heat treatment can be applied to recrystallize the alloy and obtain a fine grain size (e.g, from about 5 micrometers to about 70 micrometers or from about 10 micrometers to about 40 micrometers) (also Step 105). Alternatively, other methods can be utilized to achieve a fine grain size, such as the rapid solidification of the alloy after melting.

The alloy article is deformed in an axially symmetric manner, such as, by extruding, swaging, drawing or rod rolling to a smaller size, which can be round, square, or rectangular (Step 106). Alternatively, the melt can be cast and rolled directly into a plate shape. The plate can be further homogenized with a suitable heat treatment, rolled to a thinner size, and recrystallized to induce a desired fine grain size.

The fine grained alloy article is deformed further by various planar rolling methods known in the art (Step 107), to reduce the thickness of the stock (e.g., by from about 85% to about 99.9%).

A recrystallization anneal (Step 108) in a protective atmosphere (e.g., high vacuum, low oxygen or reducing atmosphere) at elevated temperature (e.g., at temperatures from about 250° C. to about less than about 95% of the melting temperature of the alloy, or from about 400° C. to about 1200° C.) produces the desired texture. The article is positioned to provide oxidation resistance during subsequent uses, such as during deposition of superconductor or buffer layers. Alternatively, the article may be annealed (Step 109) to form a protective epitaxial oxide layer.

Rolling processes suitable for use with methods of the present invention as shown in FIGS. 1 and 2, utilize the following parameters. Rolling is typically performed at room temperature, with a rolling speed of between about 0.10 meters per minute and about 100 meters per minute. The reduction schedule typically follows a constant strain per pass, with reduction steps being set at, for example, between about 5% and about 40% per pass. The resulting tape can be lubricated during rolling, or rolled without any lubricant. Bidirectional rolling is preferred. The tapes can be rolled with various size rolls, including large diameter rolls (e.g., about 3.5" to about 8" or larger in diameter) or with small diameter rolls (e.g., about 0.75" to about 2" in diameter) which are preferably backed up by larger rolls, in a so-called four-high arrangement. An alternative to the four-high arrangement is the cluster rolling mill. A planetary rolling mill can be used as well.

Referring to FIG. 2, a block diagram illustrates a process 200 for forming a biaxially textured alloy with improved oxidation resistance, which uses a sheath and core approach. A sheath is biaxially textured, which, for example, can be a cube texture, while the core provides a high concentration of oxide former needed to provide the oxidation resistance during the subsequent buffer layer and superconductor deposition processes. For the sheath and core approach, a thick walled can (Step 201) is made of stock of the first metal, the second metal, or an alloy of the first and second metals, and optionally one or more oxide formers. The thickness of the wall is, for example, between about 5% and about 90% of the can outside radius. A core is made to fit inside the can using a melt process or one of the variations described below. (Step 202). The core contains the alloy.

Figure 2B:
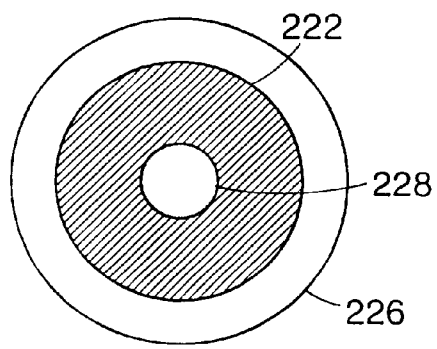
FIG. 2B illustrates a rolled foil as a wrap material for a core.
Figure 2C:
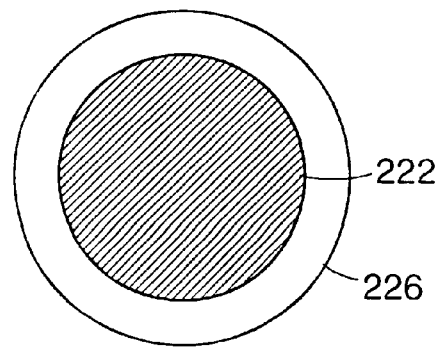
FIG. 2C illustrates a rolled foil as a core for a can.

In one variation, known as the "rolled foil" or "jelly roll" variation, as shown in FIG. 2A, individual foils 220a–220b of the first metal, the second metal and an oxide former or alloys thereof 220c, can be stacked together and rolled into a bar 222, a so called "jelly roll", which can be used as a core material or a wrapping for a central core. Aluminum is a particularly useful oxide former in making rolled foils, due to its deformability. In FIG. 2B, the rolled foil bar 222 is illustrated inside an outer layer of can 226 and is a wrap material for a core 228. In FIG. 2C, the rolled foil 222 is illustrated inside a can 226 process and is the core for the can.

Referring to FIG. 3, a block diagram illustrates a process 300 for forming an alloy substrate with a biaxially textured surface (or preferably cube textured surface) and improved oxidation resistance, which uses a powder metallurgy variant of the sheath and core approach. This is one of the preferred embodiments of the general sheath and core method illustrated in FIG. 2. A sheath is worked into the desired biaxial texture while a powder metallurgy core provides sufficient oxide former to provide the oxidation resistance during buffer layer and superconductor layer deposition. For this approach 300, a thick walled can (step 301) is made of stock of the first metal, the second metal, or an alloy of the first and second metals, and optionally one or more oxide formers as generally described in Step 301.

The thickness of the wall is between, for example, about 5% and about 20% of the can outside diameter. The can is filled with a mixture of elemental powders (step 302) or alternatively, pre-alloyed powders. The powder mixture is poured into the can at tap-density (Step 302), or is compacted into the can using a press with a compacting ram.

Each elemental or alloy powder should have the ability to deform well when consolidated into a powder mixture. The powders are then deformed to high areal reductions in order to form the substrate. Many elemental and alloyed fcc powders (i.e., face centered cubic powders) have been found to be well suited. Some hexagonal powders, such as Mg, are more difficult to deform and are easier to incorporate in the as-alloyed fcc solid solution, such as Cu-2 atomic % Mg. The same is true for an element such as, for example, Ga which is difficult to deform, and readily melts at ambient temperature processing. An alloy such as Cu-5 atomic % Ga has been found to deform very well up to high areal reductions; an atomized Cu-5 atomic % Ga powder has been found to be the ideal way to incorporate this element in the core of the substrate material. Other oxide formers, like Y, are also difficult to deform, and require deformation at elevated temperatures if an elemental incorporation is desired.

Cores formed by a melt process, by a powder metallurgy process, or by the rolled foil process of FIGS. 2A–2C, are placed inside the can and the assembly is evacuated, sealed, and extruded, swaged, drawn, or rolled to a smaller cross-sectional bar or tape (Step 203). This is processed further to a desired starting size to enable for the planar rolling to commence (Step 204). The resulting bar, wire, tape, sheet or foil is deformed in a planar manner such as rolling (Step 205), to a reduction in thickness of between, for example, about 85% and about 99.9%.

Figure 7:
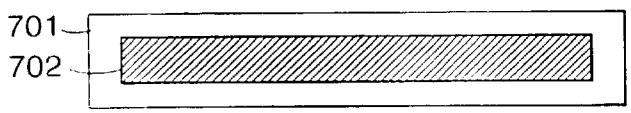
FIG. 7 illustrates a partial cross-sectional view of a substrate with a sheath and a powder metallurgy core.

A partial cross-sectional view of the substrate 700 in this stage is shown in FIG. 7, with a powder metallurgy core 702 inside of a can 701. Example seven discusses the details of a process that uses a copper can and a Cu+37 atomic % Al PM core.

Figure 8:
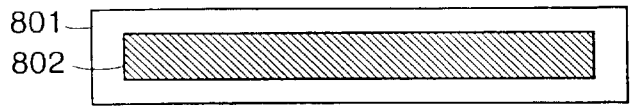
FIG. 8 illustrates a partial cross-sectional view of a substrate with a sheath and a core.

In FIG. 8 a partial cross-sectional view of a substrate 800, in this stage of the process, shows a core, such as a melt process core, 802 inside a sheath 801. A heat treatment (Step 206) follows in order to develop biaxial texture on the surface of the sheath, and to induce homogenization in the substrate. Temperatures can range from, for example, about 250° C. to as high as 95% of the melting temperature of the substrate. The oxide former can diffuse towards the surface of the substrate, but reach the surface after the biaxial texture (or cube texture) has been developed on its surface. The enrichment of the surface layer with oxide formers tends not to adversely affect the quality of the established cube texture. Upon diffusion, the oxide former is positioned to provide oxidation resistance during the subsequent buffer layers and superconductor deposition processes.

Alternatively, the textured substrate can be annealed (Step 207) in a gas flow with a low oxygen partial pressure (e.g., between about 0.01 volume percent and about 5 volume percent oxygen) to form an epitaxial oxide layer which is part of the buffer layer, or can serve as the buffer layer needed for the later superconductor deposition process.

When using a copper sheath, a recrystallization step at, for example, about 300° C. remains possible before commencing the rolling to refine the Cu grain size to, for example, from about 5 micrometers to about 50 micrometers. The refined grain size is beneficial to obtain a cube texture in the rolled and heat treated tapes.

With small amounts of first oxide former (e.g., less than about 3 atomic percent) in the sheath, a same or different oxide former can be added in larger concentrations (e.g., about 3 atomic percent to about 25 atomic percent) to the core. Sheaths without oxide formers may also be used. Pure elemental cores are also possible for certain oxide formers, such as Al, Yb, or Hf, Ce, Ti, Zr, or mixtures of these because of their deformation ability. A high quality biaxial or cube texture can be obtained on the surface of the alloy article. The core can supply the oxide former, which diffuses from the core to the surface of the substrate after the texturing is completed, where it can form an oxide (e.g., a native oxide).

Referring to FIG. 4, a block diagram illustrates a process 400 for forming an alloy article with a biaxially textured surface or cube textured surface and improved oxidation resistance, and which uses a variation on the powder metallurgy embodiment or the rolled foil embodiment of the sheath and core process. When selecting the starting powders or foils (Step 401), a powder or foil of the first metal, the second metal, or an alloy of the first and second metals is chosen that contains from about 0.2 weight percent to about 1 weight percent oxygen. The presence of oxygen can be used to assist in the internal oxidation of some of the oxide formers. Additional powders or foils, such as an oxide former which is easily deformable, or a pre-alloyed powder or foil the first metal, is selected for a total concentration, with the oxygen-containing powders or foils, of 3 to 50 atomic % oxide former, and the balance being the first metal (Step 402). The composite is to be processed with the oxygen-containing starting powders or foils. For example, a can of Cu is packed with a powder mixture that includes 60 atomic % Cu-25 atomic % Ni-15 atomic % Al, all in elemental powder form. The Ni powder contains 0.6 weight % oxygen, and the oxygen in the Cu and Al powder is negligible. The processing is similar to the approach illustrated in FIG. 2, except that intermediate anneals are not recommended to avoid premature hardening of the substrate material (Step 403). During the final heat treatment (Step 404) at temperatures which can range from 250° C. to as high as 95% of the melting temperature of the substrate, the oxygen reacts to binds with a portion of the oxide former to form an oxide dispersion strengthened alloy. Thus, in the example, a small percentage of the Al is used to bind the oxygen in the Ni powder into $Al_2O_3$ to strengthen the substrate. Any remaining Al which is available enhances the oxidation resistance of the substrate. These oxide particles generally occupy 0.2 to 2 vol % of the core material. For this type of strengthening, also known as oxide dispersion strengthening, the result provides a sufficiently large volume percentage of oxide particles to significantly enhance both the room temperature and high temperature strength of the substrate. Both types of strength enhancement are important; room temperature handling of the substrate, high temperature handling during the various deposition processes, and then room temperature handling of the final coated conductor in subsequent cabling or winding operations.

Referring to FIG. 5, a block diagram illustrates a process 500 for forming an alloy with a biaxially textured surface or cube textured surface and an improved CTE (i.e., coefficient of thermal expansion) matches among the substrate, the buffer layer, and the superconductor layer. The mismatch between the CTE of the primary substrate material and either the superconducting layer or the buffer layer can be reduced by incorporating into the alloy substrate another element with a much lower CTE, such as Nb, Mo, Ta, V, Cr, Zr, Pd, Sb, NbTi, an intermetallic such as NiAl or $Ni_3Al$, or mixtures thereof.

To assist in alloying these additional elements, the CTE-reducing material is preferably included as a rod embedded in the alloy. In one embodiment multiple CTE-reducing rods may be used. Nb and NbTi are preferred elements because they are quite ductile, and can be deformed in a Cu matrix. The effect can be roughly proportional to the volume of the Nb or NbTi, but at elevated temperatures, when the Cu or CuNi begins yielding at very low strains, the influence of the work hardened Nb is even stronger as Nb does not recrystallize at temperatures below 1100° C. In other words, only a small amount of Nb (CTE: $7.5 \times 10^{-6}$/° C. can be used in the substrate to make it an effective CTE reducing agent. Typically the rod of CTE reducing material occupies 5 to 40 vol % of the billet, with 10–20% being preferred. An oxide former, such as Al or Mg, is included in the alloy that surrounds the CTE-reducing rod to provide oxidation protection for the rod during the buffer layer and superconductor layer deposition processes. This approach to reduce the overall CTE of the substrate can be used in any of the substrate-forming processes discussed above (Step 501) or in the prior art processes for forming superconducting substrates.

Figure 10:
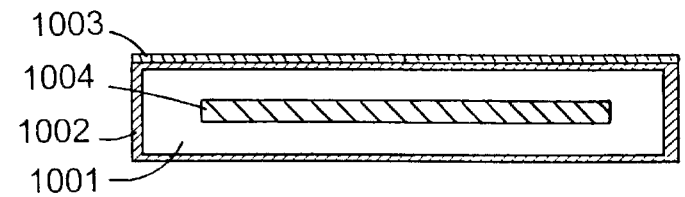
FIG. 10 illustrates a partial cross-sectional view of a composite similar to the one illustrated in FIG. 9, in which the core includes a material with a low CTE.

In a preferred embodiment, one or more rods of a CTE-reducing material are placed in one or more bores in the billet for process 100, or in the core of the composite billet for processes 200, 300 or 400 (Step 502). The billet is processed into the final substrate according to any of processes 100–400 (Step 503) with a standard texturing heat treatment. The final substrate includes one or more rods of CTE-reducing material which reduce the overall CTE of the substrate, to preferably about $10-15 \times 10^{-6}$/° C., the exact value depending on the composition and the volume % of the rods. However, because the rods are located inside the substrate they do not impair any biaxial texture which is developed on the surface of the substrate by the process of the invention. An illustration of a partial cross section of a substrate produced by this process is shown in FIG. 10. In this figure, the center includes a rod of CTE reducing material 1004, such as Nb, surrounded by the substrate material 1001. A buffer layer 1002 completely surrounds the substrate material 1001 and has a superconducting layer 1003 on at least one side. In one embodiment, the rod can be coated with a thin layer, such as gold, which can prevent a reaction between the rod and an alloy in the core.

Referring to FIG. 6, a block diagram illustrates a process 600 for forming a biaxially textured or cube textured alloy with improved surface smoothness. The process may be used as a final step to smooth the substrate before commencing the buffer layer deposition or coating superconductor. The surface smoothness of the substrate is a desirable aspect in the deposition of a smooth, exclusively c-axis oriented superconducting film (that is, with the c-axis normal to the substrate surface). If the surface roughness exceeds 10–20 nm Ra the current carrying capability of the superconductor film can be strongly reduced. Rolling of substrate materials as described can produce a very smooth surface, well within the 10 nm roughness range. The heat treatment to bring out the texture however can result in grooves, which can increase the surface roughness. Methods to remove these grooves, such as mechanical or electropolishing of the substrate, remove substrate material as well, and can lead to a loss in dimensional control.

In one preferred embodiment, a low reduction rolling pass, following a recrystallization heat treatment, restores the original surface smoothness, while a low temperature stress anneal, at temperatures below the recrystallization anneal, restores the high quality biaxial texture to the surface of the substrate. Any of the five processes 100–500 or a prior art substrate forming process can be selected to make a substrate with reduced surface grooving. The selected process is first entirely completed, including the texturing anneal (if any) (Step 601). The substrate is subsequently rolled once or twice (Step 602) using a reduction per pass of, for example, from about 5% to about 30%, with rolls having an extremely fine finish (e.g., tungsten carbide with a 25–50 nm Ra surface roughness or chromium-plated steel rolls with a 5 nm Ra surface roughness). The substrate is then given a low temperature stress anneal (Step 603), in a protective environment which does not lead to a recrystallization. A temperature range of from about 200° C. to about 400° C. is typical. The resulting substrate has a very smooth surface with a surface roughness of from about 5 Ra to about 50 Ra and a well developed, undisturbed, and well-preserved biaxial texture.

Alloys that can be used as substrate for superconductors, superconductor including such substrates, and method of making these alloys, substrates and superconductors are disclosed in commonly assigned U.S. patent applications Ser. No. 09/283,775, filed on even date herewith and entitled "ALLOY MATERIALS", 08/943,047, filed Oct. 1, 1997, and 08/942,038, filed Oct. 1, 1997.

EXAMPLE 1

Copper metal of sufficient purity such as Electrolytic Tough Pitch ("ETP") or Oxygen Free High Conductivity ("OFHC") Cu, Ni metal with a purity of more than 99%, Al metal with a purity of more than 98%, and Hf and Ti metals with a purity of more than 98% are weighed to obtain a Cu-16 atomic % Ni-0.5 atomic % Al-0.05 atomic % Hf-0.05 atomic % Ti mixture. The weighed Cu, Ni, Al, Hf and Ti are put in a suitable refractory crucible such as (but not limited to) alumina or zirconia, and are melted together. For a clean melt, an induction melter can be used, in which the melting is done in vacuum or in a protective atmosphere, but melting in air, and/or melting using other heater types such as arc melting or the use of resistance furnaces are possible. The alloy is remelted two or three times to ensure additional compositional homogeneity. The melting temperature is 1105° C. The cast is cleaned, and deformed by rolling, swaging or extrusion to a smaller diameter with sufficient size to allow subsequent deformation processing. At this size, it is again homogenized by holding the alloy at elevated temperatures for a few hours to a few days, depending on temperature. Effective temperatures should exceed 700° C. A preferable combination is 12 hrs at 1000° C. The alloy bar is then deformed by rod rolling, swaging, wire drawing or extrusion to a smaller size, which is typically round or rectangular in cross section, but can be oval or square as well. All of these different cross sections have been demonstrated to be equally effective for further processing. The thinnest dimension typically varies between 1 mm and 10 mm. The alloy wire, rod, tape or strip is then rolled to a thin tape or foil. The reduction in thickness is larger than 80% and can be as high as 99.9%. One example is the extrusion of a homogenized 30.5 mm or 15.7 mm diameter bar to a 3.8 mm×2 mm tape. The tape is rolled to 37 micrometers, a reduction in thickness of 98.1%. Another example is the swaging of a bar to a diameter of 6.2 mm and subsequent rolling to a thickness of 250 microns, a reduction in thickness by rolling of 96.0%. The rolling is performed with a conventional wire flattening mill. A wide variety of rolling conditions have been used successfully. For example, we have rolled the CuNi based substrate materials at 5%, 10%, 20% and 40% deformation per pass, using various lubrication schemes, and at speeds as low as 0.1 meter per minute or as fast as 100 meters per minute. In general, the lower reductions per pass and lower processing speeds result in somewhat improved textures.

The texturing anneal can be performed using a wide range of temperatures, ranging from 250° C. to close to the melting temperature of the alloy (around 1105° C.). The higher temperatures require a shorter time and lead to slightly better textures, but can increase surface irregularities at the grain boundaries. This effect, also known as thermal grooving, leads to depressions in the surface at the grain boundaries due to surface tension effects, and is less desirable for high quality buffer layers and superconducting layers. Lower temperature anneals have a much lower rate of thermal grooving, but also a less well developed texture. The temperature range of 850–1000° C., for a period of 1 to 24 hrs, and using a vacuum or protective atmosphere to avoid oxidation of the substrate, are preferred conditions. This process results in a substrate with a cube texture and no substantial secondary textures, a FWHM value of 7–9°.

The resulting thermal grooving is eliminated with the following processing step. The texture annealed tape is rolled once using very smooth rolls, typically with a surface roughness of about 5 nm Ra, to a reduction of 5% to 20%, with 10% being preferred. The substrate is then stress annealed at low temperatures, 300° C. being preferred for the CuNi alloys, under protective atmosphere such as a vacuum. This procedure does not adversely affect the texture quality, or may improve it. It greatly enhances the surface smoothness of the substrate material, improving it to better than 5 nm Ra. The substrate is then ready for the next step in the superconductor manufacturing process, typically the application of a buffer layer.

EXAMPLE 2

Electrolytic Tough Pitch copper, nickel with a purity grater than 99% aluminum with a purity greater than 98% and hafnium and titanium with a purity greater than 98% are weighed to obtain mixture containing 26.5 atomic % nickel, 0.5 atomic % aluminum, 0.05 atomic % titanium, and 0.05 atomic % hafnium with the balance copper. The weighed metals are placed in an alumina crucible. To insure a clean melt the charge is vacuum induction melted at 1250° Celsius and a vacuum of 50 millitorr, and cooled to room temperature. The alloy is melted two more times to insure material homogeneity. The melt is allowed to cool slowly, under vacuum, to minimize voids due to shrinkage. The cast billet is 33 mm in diameter by 75 mm long. The billet is machined to 31.8 mm diameter to improve surface finish. The machined billet is swaged to 16.8 mm diameter. After swaging the billet is homogenized at 950° Celsius for 24 hours in a protective argon 5% hydrogen reducing atmosphere. After homogenization the billet is machined to 15.6 mm and hydrostatically extruded to a tape with a 2 mm by 3.8 mm cross section. The tape is then rolled with a constant reduction of 0.127 mm per pass to 0.051 mm final thickness, the reduction of the final pass being adjusted as required to achieve the desired thickness. The rollling is done on a four high wire flattening mill with 25 mm diameter work rolls and a speed of 3 m per minute. The finished tape is then annealed at 850° Celsius for 4 hours argon 5% hydrogen reducing atmosphere. This process produces a tape having a cube texture d surface with a FWHM of 12°, and no substantial secondary texture.

EXAMPLE 3

Figure 11:
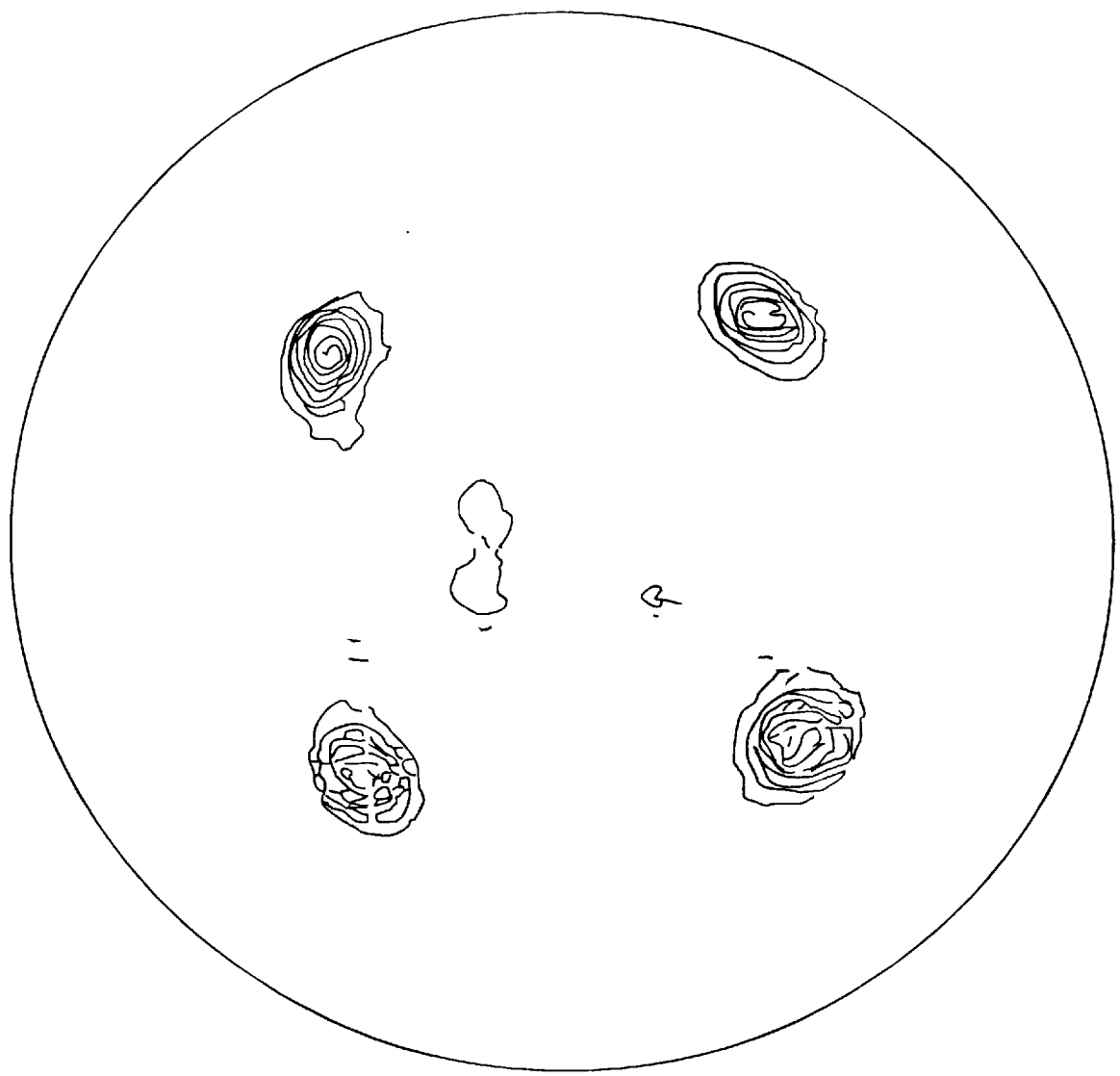
FIG. 11 illustrates a (111) pole figure of a cube textured alloy made in accordance with the invention.

Electrolytic Tough Pitch copper, nickel with a purity greater than 99% and aluminum with a purity of greater than 98% are weighted to obtain a mixture containing 37 atomic % nickel, 0.5 atomic % aluminum, with the balance copper. The weighed metals are placed in an alumina crucible. To insure a clean melt the charge is vacuum induction melted at 1280° Celsius and a vacuum of 50 millitorr, and cooled to room temperature. The alloy is melted two more times to insure material homogeneity. The melt is allowed to cool slowly, under vacuum, to minimize voids due to shrinkage. The cast billet is 33 mm in diameter by 75 mm long. The billet is machined to 31.8 mm diameter to improve surface finish. The machined billet is swaged to 16.8 mm diameter. After swaging the billet is homogenized at 1000° Celsius for 24 hours in a protective argon 5% hydrogen reducing atmosphere. After homogenization the billet is machined to 15.6 mm and hydrostatically extruded to a tape with a 1.52 mm by 3.8 mm cross section. The tape is then rolled with a constant reduction of 0.127 mm per pass to 0.061 mm final thickness, the reduction of the final pass being adjusted to achieve the desired thickness. The rolling is done on a four high wire flattening mill with 25 mm diameter work rolls and a speed of 3 m per minute. The finished tape is then annealed at 850° Celsius for 4 hours in a argon 5% hydrogen atmosphere. This process produces a tape and a cube textured surface with a FWHM of 14°, and no substantial secondary texture. FIG. 11 shows the (111) pole figure for this material.

EXAMPLE 4

An alloy comprising Cu-1.2 atomic % Al is made according to example 1. The alloy is made into a 16 mm round bar, and is drilled along the axis to create a bore in order to accommodate a 9.5 mm diameter Nb rod. This CuAl+Nb composite billet is extruded to a 3.2 mm diameter round exthudate, and subsequently drawn and rolled to achieve a 97% reduction in thickness. An anneal at 850° C. yields a biaxially textured substrate. The Nb core does not interfere with the surface texture of the substrate. The CTE for this composite material is measured to be $13.4 \times 10^{-6}/°$ C. at room temperature. In the extruded material, the volume % of the Nb in the composite is determined to be 37.6 volume %. This percentage yields a calculated average CTE of $13.4 \times 10^{-6}/°$ C. using the Rule of Mixtures, confirming the measured value. The Rule of Mixtures predicts that the CTE of a composite material is the average of the CTE of its components (which are $17.0 \times 10^{-6}/°$ C. for CuAl and $7.5 \times 10^{-6}/°$ C. for Nb), taking into account their relative volume percentages. This demonstrates that the CTE of a substrate can be carefully adjusted to provide an improved CTE match with the buffer layer and superconducting layer.

EXAMPLE 5

Electrolytic Tough Pitch copper with a purity greater than 99% and aluminum with a purity of greater than 98% are weighed to obtain a mixture containing 9 atomic % aluminum, with the balance copper. The weighed metals are placed in an alumina crucible. To insure a clean melt the charge is vacuum induction melted at 1100° Celsius and a vacuum of 50 millitorr, and cooled to room temperature. The alloy is melted to more times to insure material homogeneity. The melt is allowed to cool slowly, under vacuum, to minimize voids due to shrinkage. The cast billet is 33 mm in diameter by 75 mm long. The billet is machined to 31.8 mm diameter to improve surface finish. The machined billet is swaged to 16.8 mm diameter. After swaging the billet is homogenized at 950° Celsius for 24 hours in a protective argon 5% hydrogen reducing atmosphere. After homogenization the billet is machined to 15.6 mm and hydrostatically extruded to a tape with a 1.52 mm by 3.8 mm cross-section. The tape is then rolled with a constant reduction of 0.127 mm per pass to 0.061 mm final thickness. the reduction of the final pass being adjusted to achieve the desired thickness. The rolling is done on a four high wire flattening mill with 25 mm diameter work rolls and a speed of 3 m per minute. The finished tape is then annealed at 850° Celsius for 4 hours in a protective argon 5%hydrogen reducing atmosphere. The finished substrate is heat treated at 830° Celsius using an oxidizing environment selected to be typical of the environment utilized during one YBCO deposition process, which is argon 1 vol oxygen gas, followed by a 100% oxygen anneal at 400° Celsius. The thin 40 micrometer thick substrate retains a biaxial surface texture and is protected from the oxidizing environment by the formation of a continuous native oxide film.

EXAMPLE 6

Electrolytic Tough Pitch copper with a purity greater than 99% aluminum with a purity of greater than 98% are weighed to obtain a mixture containing 5 atomic % aluminum, with the balance copper. The weighed metals are placed in an alumina crucible. To insure a clean melt the charge is vacuum induction melted at 1080° Celsius and a vacuum of 50 millitorr, and cooled to room temperature. The allow is melted two more times to insure material homogeneity. The melt is allowed to cool slowly, under vacuum, to minimize voids due to shrinkage. The cast billet is 33 mm in diameter by 75 mm long. The billet is machined to 31.8 mm diameter to improve surface finish. The machined billet is swaged to 16.8 mm diameter. After swaging the billet is homogenized at 950° Celsius for 24 hours in a argon 5% hydrogen atmosphere. After homogenization the billet is machined to 15.6 mm and hydrostatically extruded to a tape with a 1.52 mm by 3.8 mm cross-section. The tape is then rolled with a constant reduction of 0.127 mm per pass to 0.061 mm final thickness, the reduction of the final pass being adjusted to achieve the desired thickness. The rolling is done on a four high wire flattening mill with 25 mm diameter work rolls and a speed of 3 m per minute. The finished tape is then annealed at 850° Celsius for 4 hours in an argon 5% hydrogen atmosphere. The finished substrate is heat treated at 830° Celsius using an oxidizing environment selected to be typical of the environment utilized during one YBCO deposition process, which is argon 1 vol % oxygen gas, followed by a 100% oxygen anneal at 400° Celsius. The thin 40 micrometer thick substrate retains a biaxial surface texture and is protected from the oxidizing environment by the formation of a continuous native oxide film.

EXAMPLE 7

A Cu-14.4 atomic % Al alloy is made using a powder metallurgy sheath and core approach. A copper powder made from electrolytic tough pitch copper, with a particle size of 250 micrometers, and an aluminum powder made by gas atomization, with a purity of 99%, and a particle size of 220 micrometers, are mixed in a ratio of 63 atomic % Cu and 37 atomic % Al. The well-mixed Cu+Al powder is compacted into an oxygen free high conductivity copper billet which has an external diameter of 30.5 mm and an internal diameter of 21.5 mm. The billet is evacuated and extruded to a 9 mm bar. The bar is drawn through round and rectangular drawing dies to a final dimension of 2.4 mm×3.6 mm. This rectangular product is subsequently rolled to a tape of 65 microns thick (97.3% reduction). This tape is two-step annealed at 600° C. and 800° C. under protective atmosphere. This yields a Cu 14.4 atomic % Al substrate with a cube textured surface, which has excellent oxidation resistance.

EXAMPLE 8

A cube-textured copper-nickel-Al alloy was produced as follows. A 32 mm diameter copper (OFC) can was loaded with a mixture of Cu, Ni and Al pieces, and the overall stoichiometry (including the weight of the copper can) was further adjusted with Cu powder, to a mixture of 51 at % Ni, 3.5 at % Al, 45.7 at % Cu. This can was placed inside a 38 mm diameter thin-walled alumina crucible and heated under vacuum using a induction melter. After solidification the alloy was freed from the crucible. The cast was remelted using a similar crucible and the same induction melter, again under vacuum. The cast alloy, which had a cylindrical shape, was machined to a diameter of 31 mm and swaged to a 18 mm diameter bar. This bar was homogenized at 950° C. for 16 hrs. It was machined to a 16 mm diameter billet, suitable for hydrostatic extrusion at elevated temperatures. It was extruded to a 6.4 mm diameter wire. This wire was annealed for one hour at 600° C. It was subsequently drawn through drawing dies with a square cross sections, measuring 5.8 mm×5.8 mm and 5.3 mm×5.3 mm. This square wire was subsequently rolled using a reversible direction rolling technique, a two high rolling mill down to a thickness of 1 mm, and a four-high rolling mill down to a thickness of 0.015 mm or less. A rolling speed of 6 m/min was used. Subsequently, it was heat treated at a 850° C. for 2 hrs under a 95% argon with 5% hydrogen gas mixture, or vacuum.

Figure 12:
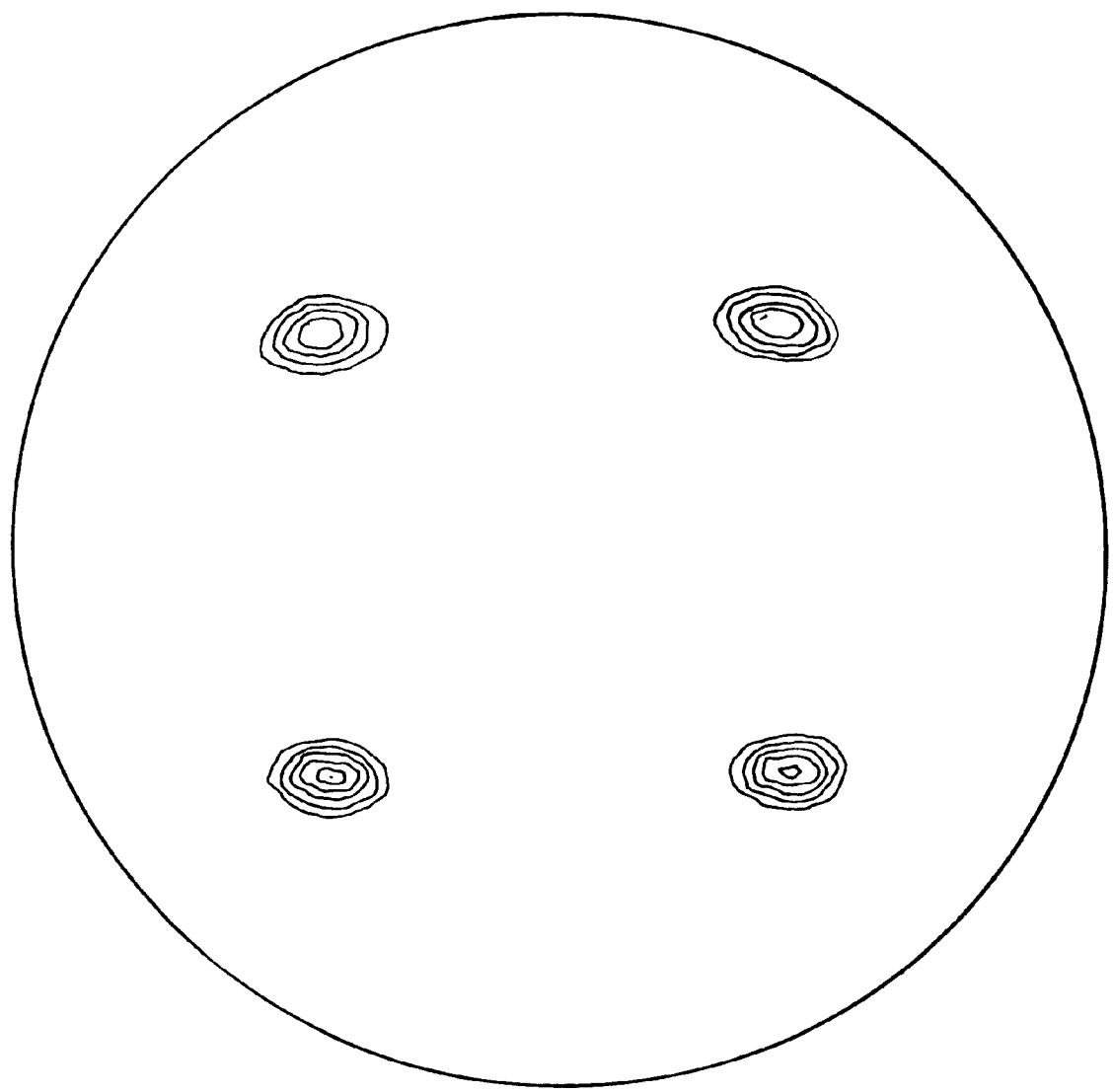
FIG. 12 is a pole figure of a copper-nickel-aluminum alloy.

This foil had a single bi-axial (100) [001] cube texture as by a 200 reflection in the theta-two theta X-ray diffractogram. No second components were visible. The (111) pole figure is shown in FIG. 12. Only a cube texture, with a FWHM value of 9° is observed.

The annealed substrate had a yield stress (at 0.2% strain) of 26.5 ksi at room temperature.

This substrate was polished after anneal to a surface roughness of Ra=5 nm. Polishing did not affect the surface texture. The substrate was put in a vacuum chamber, which is evacuated to $10^{-6}$ torr. The sample was heated to 800° C. and provided with an epitaxial yttria-stabilized zirconia buffer layer, which had a layer thickness of 0.6 micrometer, using a Pulsed Laser Deposition method. Subsequently a 1 micrometer thick epitaxial $YBa_2Cu_3O_{7-x}$ layer was deposited on top of the buffer layer. The $YBa_2Cu_3O_{7-x}$ layer was superconducting, and demonstrated a superconducting critical current density of 160,000 A/cm$^2$ at 75 K, in the absence of a magnetic field other than the small magnetic field created by the current in the tape itself (the so-called self field).

EXAMPLE 9

An ingot was vacuum cast having the following composition: 47.4 at % Ni, 2.2 at % Al, and 50.4 at % Cu. The ingot had a length of 15", and a diameter of approximately 3". The ingot was machined to a 2.5" round billet with a length of 8". This billet was heated to 1000° C. in a flowing argon atmosphere, and subsequently extruded in a 300 ton ram-type extrusion press to a 1" diameter bar. The bar was cleaned and homogenized at 1000° C. for 16 hrs. It was swaged to 0.75" diameter using a four-die swaging machine. The bar was stress relieved at 600° C. and rolled using a 2H rolling mill to a 0.3"×0.77" strip without using lubricant. The strip was heat treated at 650° C., and polished. It was rolled using 5% reduction per pass to 0.1" thickness in a 2H rolling mill using a suitable lubricant, and mirror polished steel rods. It was rolled to 0.008" thickness using a 5% or 10% or 20% reduction per pass. Higher reductions per pass were favored as it enhances the production speed. The 0.008" thick foil was heat treated at 1000° C. for 45 minutes. This foil had a cube textured surface with a 9° FWHM. It had a grain size of 50–100 micrometer, with no evidence of abnormal grain growth.

EXAMPLE 10

The production of substrates with a composition of Cu with more than 0.5 at % Al by rolling and annealing can lead to mixed textures (e.g. a so-called brass textures). To make cube textured substrates with a composition such as Cu-3.5 at % Al or Cu-9 at % Al copper cans were filled with a mixture of copper and aluminum.

The mixture was formed by using copper and aluminum powders. These powders were co-extruded in the copper can to a rod, which was then rolled and texture annealed. The copper sheath rapidly formed a cube texture while with prolonged time the aluminum diffused to the cube-textured surface and created a Cu-3.5 or 9 at % Al substrate with a sharp cube texture.

Two billets were made for ram type extrusions in a 300 ton extrusion press. The cans were eight inches long, consisted of pure copper. Cu and Al powders were mixed using two types of mixtures. In the first mixture, the composition was 95 at % Cu-5 at %Al. In the second mixture, the composition is 86 at % Cu-14 at % Al. After compaction, extrusion, rolling and annealing the aluminum diffused into the sheath, and a homogeneous substrate remained, with an overall compositions of Cu-3.5 at % Al and Cu-9 at % Al. Powders were carefully mixed and poured in six or seven steps into the cans. After each fill the mixture was compacted at 7 ksi, yielding about 75% packing density. This was sufficiently dense to prevent the collapse of the wall during extrusion, but sufficiently loose to allow fast outgassing during evacuation. The cans were capped with a Cu cap. The Cu caps had a grove in the side to facilitate outgassing. The billets were put in the chamber of an E-beam welder and evacuated overnight. The caps were then welded using a welding depth of approximately ¼". The cans cooled in the chamber and are subsequently transported to the extrusion facility. During the upset stroke the billet compacted quite homogeneously to close to 100% density before actual extrusion starts.

Figure 13A:
FIGS. 13a–c are cross-sectional views of a Cu-9 at % tape during the rolling process.
Figure 13B:
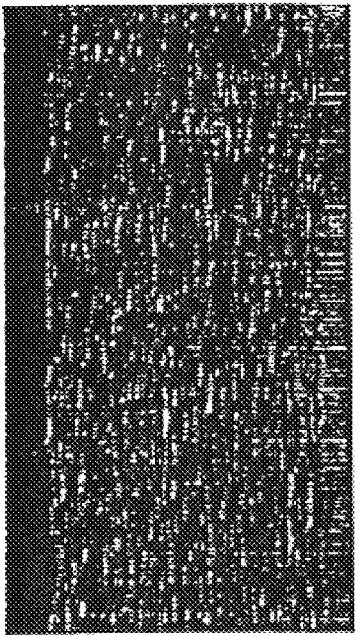
Figure 13C:
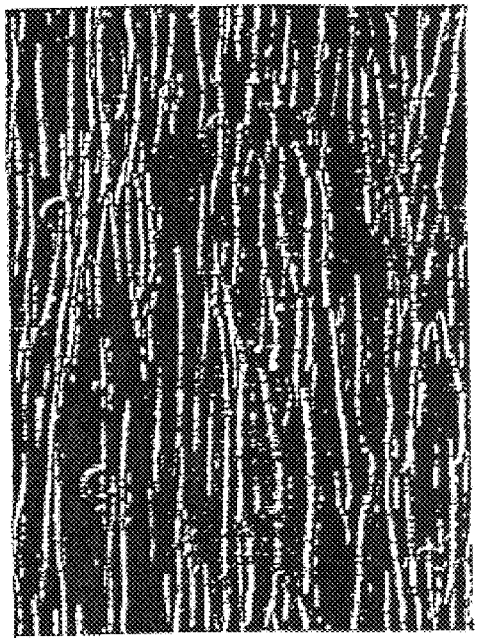

The billets were pre-heated at 250° C., and extruded to a 1" round bar. The extrudates were water-quenched after extrusion. The extrudates were swaged with a four-die swager to 0.75" diameter. These were then rolled using a 2H rolling mill to a 0.008" thick substrate. No stress anneals were used or needed. The rolling mill had a set of 4" diameter steel rolls, polished to a mirror finish. This resulted in a surface roughness value Ra of about 10 nm at the substrate as measured with a Zygo light interference microscope. FIGS. 13a–c show, at varying magnification (4×, 40× and 175×, respectively) a perpendicular cross-section of the Cu-9 at % Al tape during the rolling process, at a thickness of 0.050". The tapes were about 0.88" wide. The powder cores, still elemental Cu+Al, were well-defined, as were the individual Cu/Al interfaces of the particles inside the cores as can be seen in FIGS. 13b and 13c.

Figure 14:
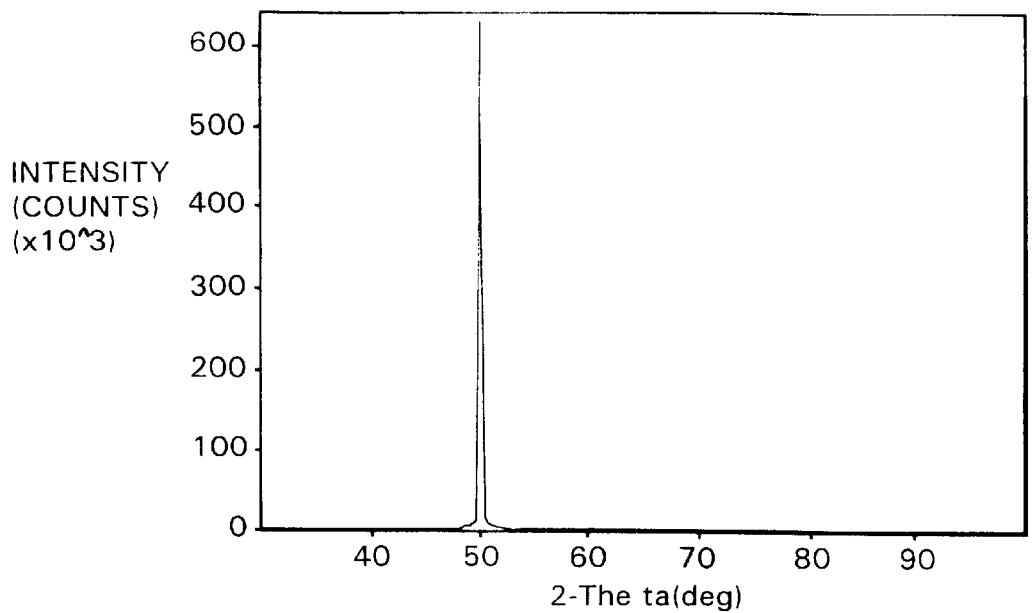
FIG. 14 is an XRD pattern of a Cu-9 at %Al alloy.
Figure 15:
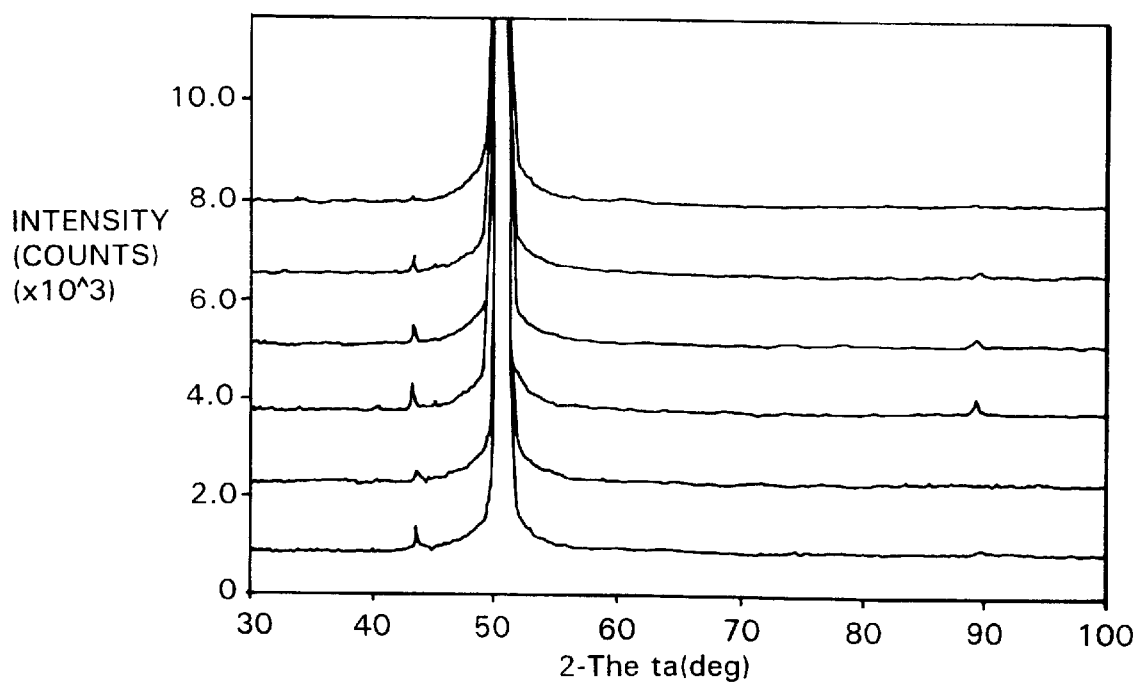
FIG. 15 shows the magnified patterns for varying anneal conditions of a Cu-9 at %Al alloy.
Figure 16:
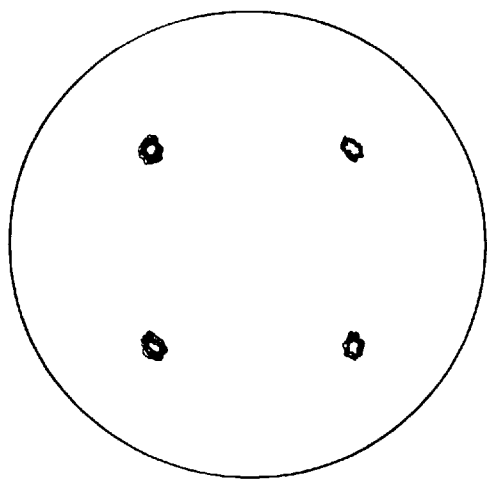
FIG. 16 is a pole figure of a Cu-9 at %Al tape.
Figure 17:
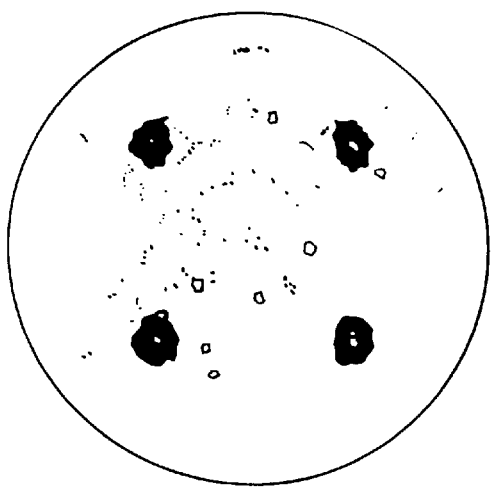
FIG. 17 is a magnified view of the pole figure of FIG. 17.

The PM tapes were annealed at 800–900° C., using either a single heat treatment at a temperature equal to, or exceeding later processing conditions anticipated for buffer and YBCO deposition or a stepped heat treatment, to avoid texture formation when the Al is still liquid. The stepped heat treatments gave better results with regards to texture. Note that at 600–900° C. the Cu sheath can give a cube texture in a very short time, in the order of a few minutes, and that the subsequent time is intended to diffuse the Al into the cube textured sheath. Six examples of heat treatments for the Cu/Cu+Al PM tapes were:
1. 400° C.-44 h+600° C.-12 h
2. 600° C.-12 h
3. 600° C.-12 h+800° C.-4 h
4. 400° C.-44 h+600° C.-12 h+800° C.-4 h
5. 600° C.-12 h+900° C.-1 h
6. 400° C.-44 h+600° C.-12 h+900° C.-1 h FIG. 14 shows the XRD pattern of the Cu-9 at %Al sample, annealed at 400° C.-44 h+600° C.-12 h+900° C.-1 h. It shows only the (200) peak, with no other peaks observable at this intensity ($I_{max}$=600,000). FIG. 15 shows the magnified patterns of the six anneal conditions for Cu-9 at %Al listed above, where: the bottom curve corresponds to heat treatment 1; the second curve from the bottom to heat treatment 2; the third curve from the bottom to heat treatment 3; the third curve from the top to heat treatment 4; the second curve from the top to heat treatment 5; and the top curve to heat treatment 6. $I_{max}$ is 12,000, indicating a 50×magnified intensity. Small (111) and other peaks are observable for some of the anneals, while the stepped anneal shows the cleanest pattern. FIG. 16 shows the (111) pole figure of the tape annealed at 400° C.-44 h+600° C.-12 h+900° C.-1 h. The (111) poles are very sharp, with a FWHM of about 5–6°. The (200) pole figure is equally sharp, and again very symmetric in all directions. FIG. 17 shows a magnified (111) pole figure, where the intensity is magnified by about 280×. This shows a few grains with random orientations. Based on integrated X-ray intensities within the (111) pole figure, the cube texture is about 99.1%, with about 0.4% random grains, and no annealing twins.

Figure 18:
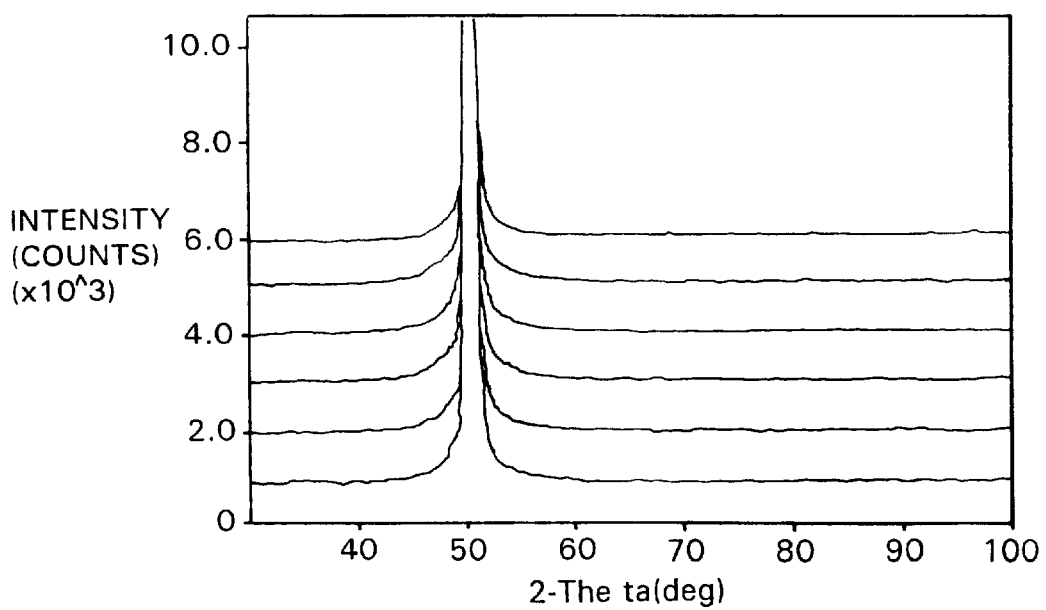
FIG. 18 is a theta-two theta X-ray diffraction scan of Cu-3.5 at %Al for varying anneal conditions.

FIG. 18 shows the 0–20 X-ray diffraction scans for the six anneal conditions of Cu-3.5 at %Al listed above, where only the (200) peak is observable. The pole figure looks very similar to that of the Cu-4 %Al sample, with the same low FWHM value.

What is claimed is:

1. An alloy, comprising:
   a first metal;
   a second metal different than the first metal; and
   at least one oxide former,
   wherein a total amount of oxide former in the alloy comprises at least about 0.5 atomic percent of the alloy, each oxide former is different than the first and second metals, the second metal is nickel, the alloy comprises at least about 25 atomic percent nickel, and the alloy has a biaxially textured surface.

2. The alloy according to claim 1, wherein the alloy has a cube textured surface.

3. The alloy according to claim 1, wherein the alloy comprises at most about 55 atomic percent nickel.

4. The alloy according to claim 1, wherein the first metal is copper.

5. The alloy according to claim 4, wherein the second metal is nickel.

6. The alloy according to claim 5, wherein the alloy comprises aluminum.

7. The alloy according to claim 1, wherein the alloy comprises at least four different metals.

8. The alloy according to claim 1, wherein the alloy has a Curie temperature of at most about 80 K.

9. The alloy of claim 1, wherein the alloy has a cube textured surface.

10. An alloy comprising:

copper;

from about 25 atomic percent nickel to about 55 atomic percent nickel; and at least about 0.5 atomic percent of at least one metal selected from the group consisting of Mg, Al, Ti, Ga, Ge, Zr, Hf, Y, Si, Zn, Sn, B, Pr, Eu, Gd, Tb, Dy, Ho, Lu, Th, Er, Tm, Be, Ce, Nd, Sm, Yb and La, wherein the alloy has a biaxially textured surface and at least about 65 volume percent of the alloy comprises grains having a biaxial texture.

11. The alloy according to claim 10, wherein the alloy has a cube textured surface.

12. The alloy according to claim 11, wherein at least about 65 volume percent of the alloy comprises grains having a cube textured.

13. The alloy of claim 12, wherein the alloy has a cube textured surface.

14. The alloy according to claim 1, wherein the alloy has a Curie temperature of at most about 80 K.

15. The method comprising:

making an alloy that comprises a first metal, a second metal different than the first metal, and at least one oxide former, wherein a total amount of oxide former in the alloy comprises at least about 0.5 atomic percent of the alloy, each oxide former is different than the first and second metals, the second metal is nickel, the alloy comprises at least about 25 atomic percent nickel, and the article has a biaxially texturedn surface.

16. The method according to claim 15, wherein the biaxially textured surface is made by rolling the alloy.

17. The method according to claim 16, wherein the biaxially textured surface is made by annealing the alloy subsequent to rolling the alloy.

18. The method of claim 15, wherein the alloy has a cube textured surface.

* * * * *